(12) United States Patent
Hiraga

(10) Patent No.: US 6,323,548 B1
(45) Date of Patent: Nov. 27, 2001

(54) SEMICONDUCTOR INTEGRATED CIRCUIT DEVICE

(75) Inventor: Noriaki Hiraga, Kyoto (JP)

(73) Assignee: Rohm Co., LTD, Kyoto (JP)

( * ) Notice: Subject to any disclaimer, the term of this patent is extended or adjusted under 35 U.S.C. 154(b) by 0 days.

(21) Appl. No.: 09/161,997

(22) Filed: Sep. 29, 1998

(30) Foreign Application Priority Data

Sep. 29, 1997 (JP) .................................................. 9-263042

(51) Int. Cl.[7] .................................................. H01L 23/48
(52) U.S. Cl. .......................... 257/692; 257/784; 257/786
(58) Field of Search .................................... 257/784, 786, 257/666, 692

(56) References Cited

U.S. PATENT DOCUMENTS 5,757,082 * 5/1998 Shibata .................................. 257/786
5,801,450 * 9/1998 Barrow .................................. 257/784

FOREIGN PATENT DOCUMENTS 60-147126   8/1985   (JP).
6-168978    6/1994   (JP).
8-279527   10/1996   (JP).

* cited by examiner

Primary Examiner—Roy Potter
(74) Attorney, Agent, or Firm—Arent Fox Kintner Plotkin & Kahn, PLLC

(57) ABSTRACT

A semiconductor integrated circuit device has a semiconductor chip, a plurality of input/output pads formed on the semiconductor chip, a frame on which the semiconductor chip is mounted, a plurality of inner leads arranged on the frame so as to extend radially with respect to each side of the semiconductor chip, and wires for connecting the input/output pads to the inner leads. The plurality of input/output pads are so arranged that, with respect to any two input/output pads that are connected to two adjacent inner leads, one input/output pad is placed on an imaginary line that is parallel to and a predetermined distance apart from the wire connecting the other input/output pad to the corresponding inner lead.

8 Claims, 6 Drawing Sheets

SEMICONDUCTOR INTEGRATED CIRCUIT DEVICE

BACKGROUND OF THE INVENTION

1. Field of the Invention

The present invention relates to a semiconductor integrated circuit device, and particularly to a semiconductor integrated circuit device in which the input/output pads of a semiconductor chip and the inner leads of the frame on which the semiconductor chip is mounted are connected electrically by bonding wires.

2. Description of the Prior Art

Usually, a plurality of input/output pads are formed around a semiconductor chip. In a semiconductor integrated circuit device, such input/output pads and the inner leads of the frame on which the semiconductor chip is mounted are connected electrically, for example, by wire bonding so that the semiconductor chip can electrically communicate with circuits or devices formed or placed outside its package.

Conventionally, in a semiconductor integrated circuit device, input/output pads are arranged as shown in FIG. 5A; that is, input/output pads 11a, 11b, 11c, . . . are arranged in a line along each side of a semiconductor chip 1, at intervals that increase toward a corner ($d_1 > d_2 > \ldots$). Alternatively, as shown in FIG. 6, input/output pads 11a, 11b, 11c, . . . are arranged in two lines along each side of a semiconductor chip 1, at regular intervals (d is constant).

On the other hand, as shown in FIG. 7, a typical frame has, with respect to each side of the semiconductor chip 1, inner leads 23 arranged in an area wider than the area in which the input/output pads are arranged (this will hereafter be referred to as "radial arrangement of the inner leads").

This causes the input/output pads that are arranged closer to a corner to form smaller wire angles θ (i.e. the angles that the wires 3a, 3b, . . . , 3m, 3n, . . . form with respect to the corresponding side of the semiconductor chip 1). As a result, if, as shown in FIG. 5B, the input/output pads are arranged at regular intervals ($d_1 = d_2 = \ldots$), the distances between the wires, as measured near the semiconductor chip 1, become shorter and shorter toward a corner ($W_1 < W_2$), increasing the risk of a short circuit occurring between wires. To avoid this, in the arrangement shown in FIG. 5A, the input/output pads are arranged at intervals that increase toward a corner. This, however, inevitably increases the chip size.

On the other hand, in the arrangement shown in FIG. 6, the input/output pads are arranged in two lines and at regular intervals, and therefore, as long as the same number of input/output pads are arranged, the arrangement of FIG. 6 requires a smaller chip size than those of FIGS. 5A and 5B. However, the use of a typical frame, in which the inner leads are arranged radially, causes the wire angles to become smaller and smaller toward a corner until, as indicated by arrow Y in FIG. 6, two adjacent wires 3a and 3b, which are connected to an outer pad 11a and an inner pad 11b respectively, cross each other.

This can be avoided by varying the wiring heights of adjacent wires. This, however, increases the thickness of the semiconductor integrated circuit device as a whole. It should be noted that an increase in thickness is as undesirable as an increase in area. Incidentally, the arrangement shown in FIG. 6 is very effective in cases where sufficiently large wire angles θ can be secured for all pads, though a special arrangement of the inner leads 23 is required on the part of the frame to secure sufficiently large wire angles θ for all pads.

SUMMARY OF THE INVENTION

An object of the present invention is to provide a semiconductor integrated circuit device in which a semiconductor chip of a minimal size can be used and in which, nevertheless, a typical frame having inner leads arranged radially can be used without increasing the thickness of the semiconductor integrated circuit device as a whole.

To achieve the above object, according to the present invention, in a semiconductor integrated circuit device in which a plurality of input/output pads formed on a semiconductor chip and a plurality of inner leads formed on a frame on which the semiconductor chip is mounted are connected electrically by wire bonding, the plurality of input/output pads are arranged in such a way that the normal from any input/output pad to at least one of the wires, or imaginary extension lines thereof, adjacent to the wire connecting that input/output pad to the corresponding inner lead has a predetermined length.

In this arrangement, for example by arranging the input/output pads in such a way that the length of the above normal is kept minimal as long as wire bonding can be performed without interference, it is possible to realize a semiconductor integrated circuit device in which a semiconductor chip of a minimal size can be used and in which, nevertheless, a typical frame having inner leads arranged radially can be used without increasing the thickness of the semiconductor integrated circuit device as a whole.

BRIEF DESCRIPTION OF THE DRAWINGS

This and other objects and features of the present invention will become clear from the following description, taken in conjunction with the preferred embodiments with reference to the accompanied drawings in which.

DESCRIPTION OF THE PREFERRED EMBODIMENTS

Figure 1:
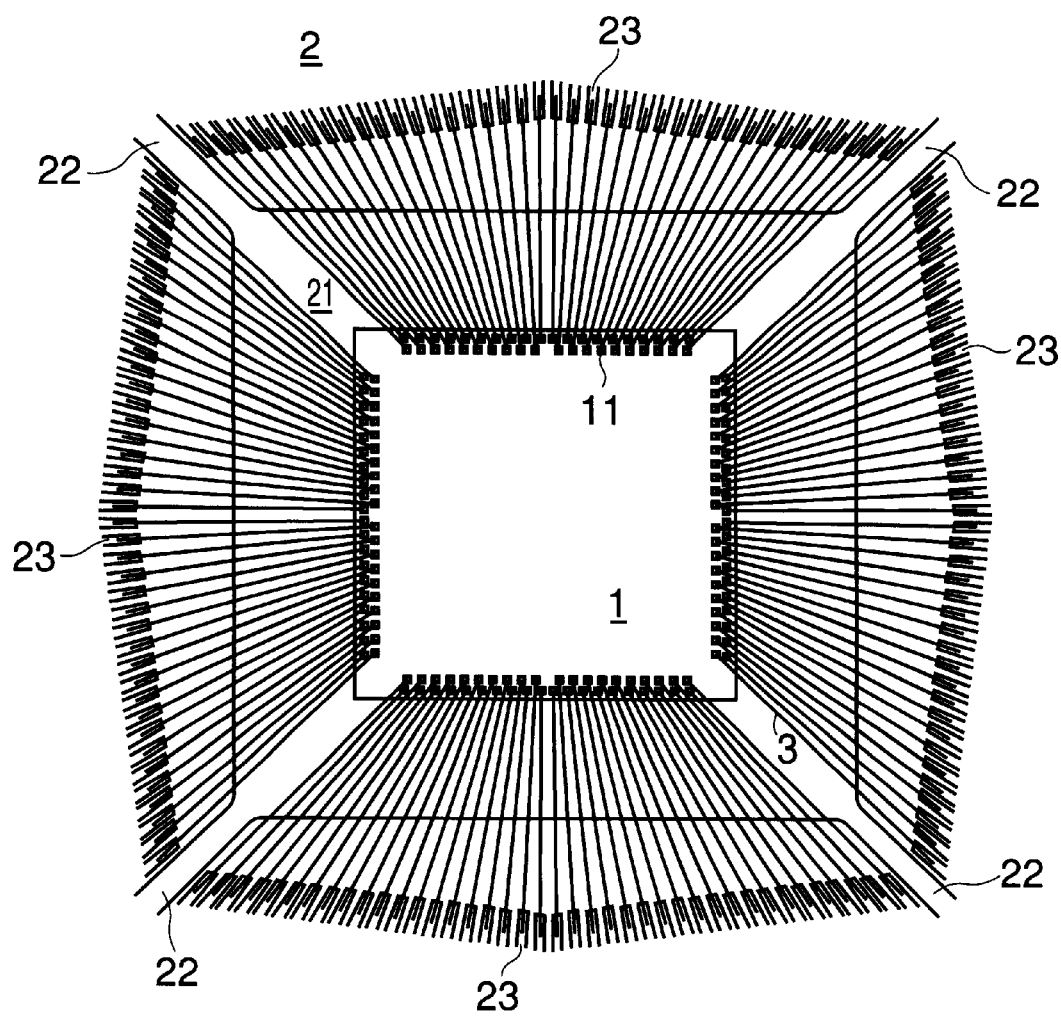
FIG. 1 is an enlarged view of a part of a semiconductor integrated circuit device embodying the invention.

Hereinafter, embodiments of the present invention will be described with reference to the drawings. FIG. 1 is an enlarged view of a part of a semiconductor integrated circuit device embodying the present invention. As shown in FIG. 1, along each side of a semiconductor chip 1, input/output pads 11 are arranged in two lines. Although, in FIG. 1, the pads arranged in the outer lines look as if making contact with the pads arranged in the inner lines, actually there exist gaps between them that keep them out of contact with each other.

The semiconductor chip 1 is mounted, by die bonding or the like, on a stage 21 formed on the frame 2. The stage 21 is formed as an island that is, at corners, supported by support bars 22. In each of the areas created by the support bars 22 dividing the surface of the frame 2, a number of inner leads 23 are arranged radially. The pads 11 and the inner leads 23 are connected by way of wires 3.

Figure 2:
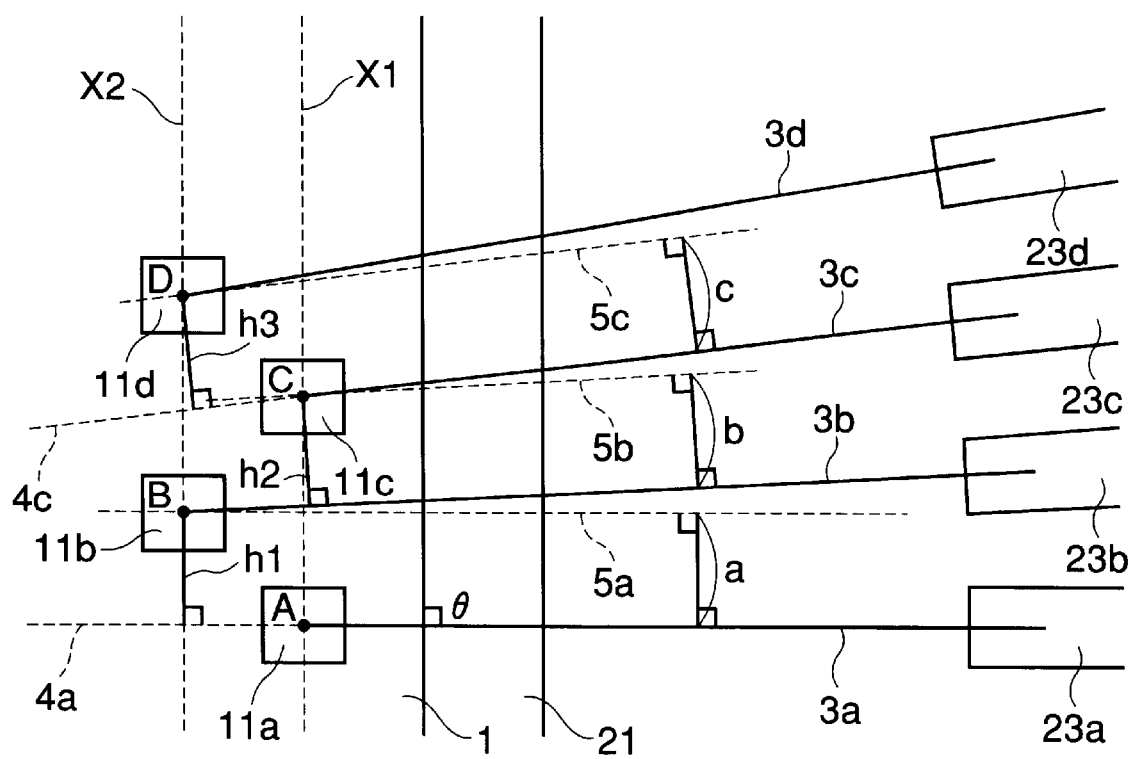
FIG. 2 is an enlarged view around the middle point of a side of the semiconductor chip shown in FIG. 1.

FIG. 2 is an enlarged view around the middle point of a side of the semiconductor chip 1 shown in FIG. 1. Now, with reference to this figure, how the positions of the input/output pads are determined will be described. For each side of the semiconductor chip, first, the position of the input/output pad 11a that is connected to the inner leads 23a located approximately at the middle of the area between two support bars 22 is so determined that its center falls on point A in the outer line X1 where a wire angle θ of approximately 90° is obtained.

Next, the position of the input/output pad 11b that is connected to the inner lead 23b adjacent to, and located closer to a corner than, the inner lead 23a is so determined that its center falls on point B in the inner line X2 where the normal h1 therefrom to the imaginary extension line 4a of the wire 3a connecting the pad 11a and the inner lead 23a has a predetermined length; in other words, point B is where an imaginary line 5a parallel to and a predetermined distance a apart from the wire 3a intersects with the inner line X2.

Next, the position of the input/output pad 11c that is connected to the inner lead 23c adjacent to, and located closer to a corner than, the inner lead 23b is so determined that its center falls on point C in the outer line X1 where the normal h2 therefrom to the wire 3b connecting the pad 11b and the inner lead 23b has a predetermined length; in other words, point C is where an imaginary line 5b parallel to and a predetermined distance b apart from the wire 3b intersects with the outer line X1.

In this way, when the position of the input/output pad connected to one particular inner lead is determined, the position of the input/output pad connected to the inner lead adjacent to, and located closer to a corner than, that inner lead is determined automatically. This is repeated until eventually the position of the input/output pad connected to the inner lead located closest to the support bar 22 at the corner is determined. In the same manner, the positions of the input/output pads are determined for the remaining half of this side, and further for the other sides. Note that, in the embodiment under discussion, any two input/output pads that are connected to adjacent inner leads are arranged in different lines.

The positions of the input/output pads are determined in the manner as described above. Meanwhile, the lengths of the normals h1, h2, h3, . . . to the wires connecting the pads and the inner leads, i.e. the predetermined distances a, b, c, . . . , are kept minimal as long as wire bonding can be performed without interference; that is, it is necessary to keep those distances as short as possible but sufficiently long, for example, to prevent the wire catching mechanism of the wire bonder from making contact with already-connected wires (such distances will hereafter be referred to simply as "minimal distances").

The above-described arrangement makes it possible to arrange the pads as densely as possible without causing interference in wire bonding. In addition, in this arrangement, the use of a typical frame in which the inner leads are arranged radially does not result in wires crossing each other. Thus, this arrangement makes it possible to realize a semiconductor integrated circuit device in which a semiconductor chip of a minimal size can be used and in which, nevertheless, a typical frame having inner leads arranged radially can be used without increasing the thickness of the semiconductor integrated circuit device as a whole.

Figure 3:
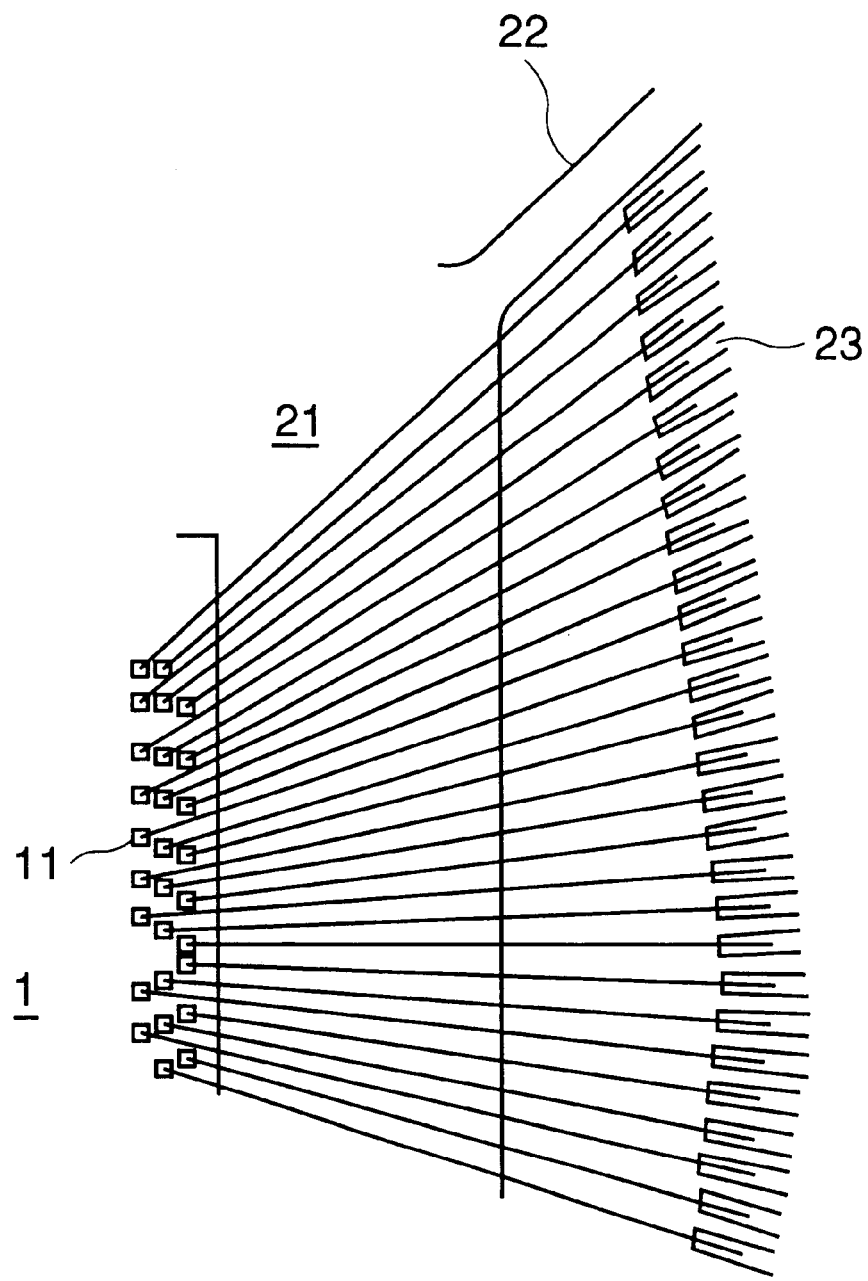
FIG. 3 is an enlarged view of a part of another semiconductor integrated circuit device embodying the invention.

FIG. 3 is an enlarged view of a part of another semiconductor integrated circuit device embodying the present invention. Also in this embodiment, the length of the normal from the center of a pad to the wire connected to the inner lead adjacent to the inner lead to which that pad is connected is kept minimal. In addition, in this embodiment, the pads are arranged in three lines along each side of the semiconductor chip 1. This helps achieve a smaller chip size than in the previous embodiment, provided that the same number of pads are arranged.

In the embodiments described above, the pads are arranged in two or three lines along each side of the semiconductor chip. However, it is also possible to arrange the pads in four or more lines as long as the length of the normal from the center of a pad to the wire connected to the inner lead adjacent to the inner lead to which that pad is connected is kept minimal.

Moreover, the input/output pads do not necessarily have to be arranged in lines along the sides of the semiconductor chip, but may be arranged in any way as long as the length of the normal from the center of a pad to the wire connected to the inner lead adjacent to the inner lead to which that pad is connected is kept minimal, and as long as the pads do not make contact with each other.

Moreover, although the determination of the positions of the input/output pads is started with the input/output pad located at the middle of each side of the semiconductor chip in the examples described above, it is also possible to start the determination with, for example, the input/output pad located at a corner, or any other input/output pad.

Moreover, in arrangements according to the present invention, the use of a typical frame in which the inner leads are arranged radially inevitably requires the semiconductor chip to have input/output pads arranged at intervals that increase toward a corner. This helps prevent a short circuit between adjacent wires.

Figure 4:
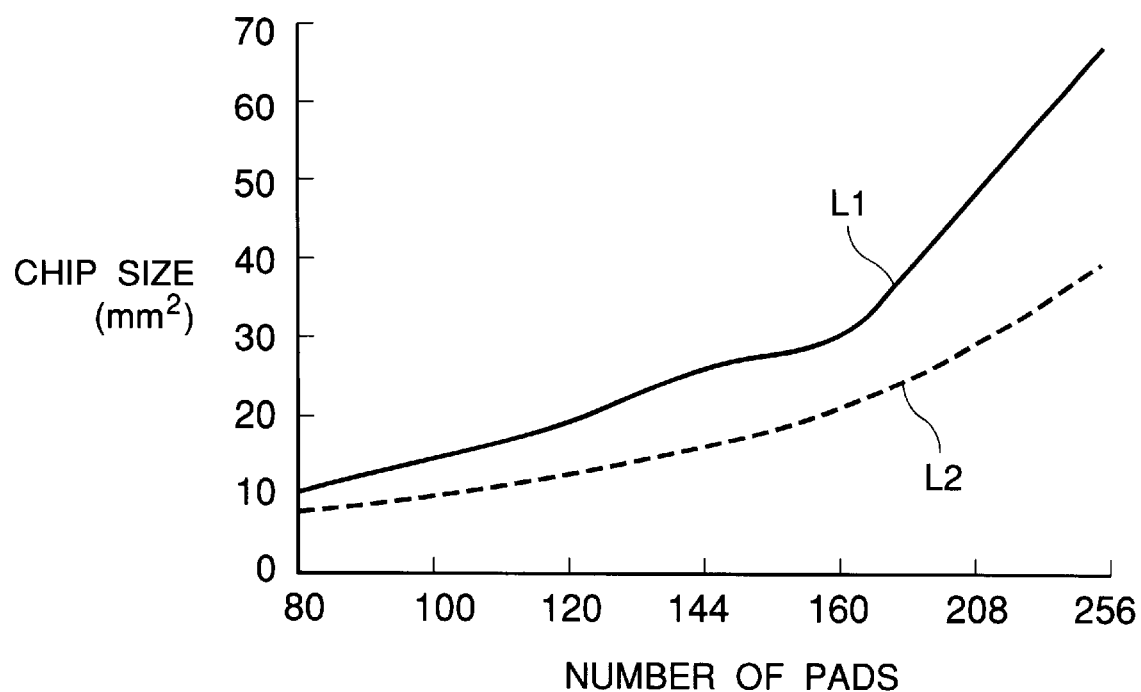
FIG. 4 is a diagram showing the results of comparison of the semiconductor chip size between conventional semiconductor integrated circuit devices and those according to the present invention.
Figure 5A:
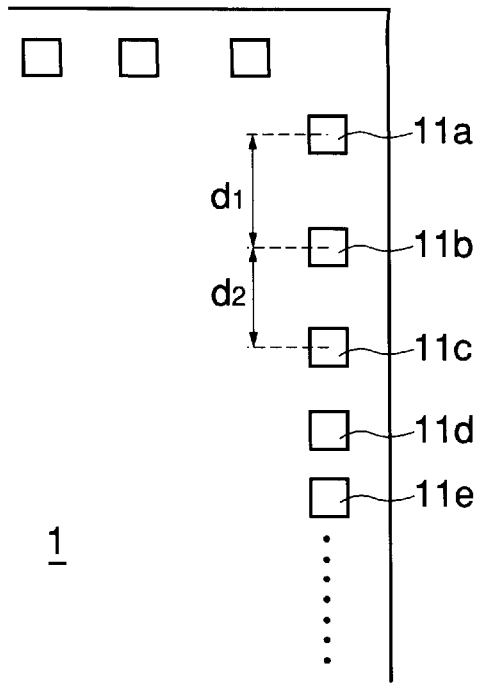
FIG. 5A is a diagram illustrating how input/output pads are arranged on a semiconductor chip in a conventional semiconductor integrated circuit device.
Figure 5B:
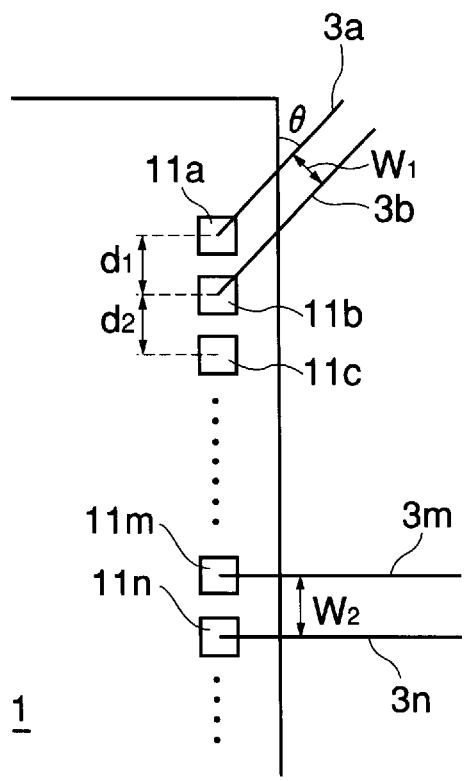
FIG. 5B is another diagram illustrating how input/output pads are arranged on a semiconductor chip in a conventional semiconductor integrated circuit device.
Figure 6:
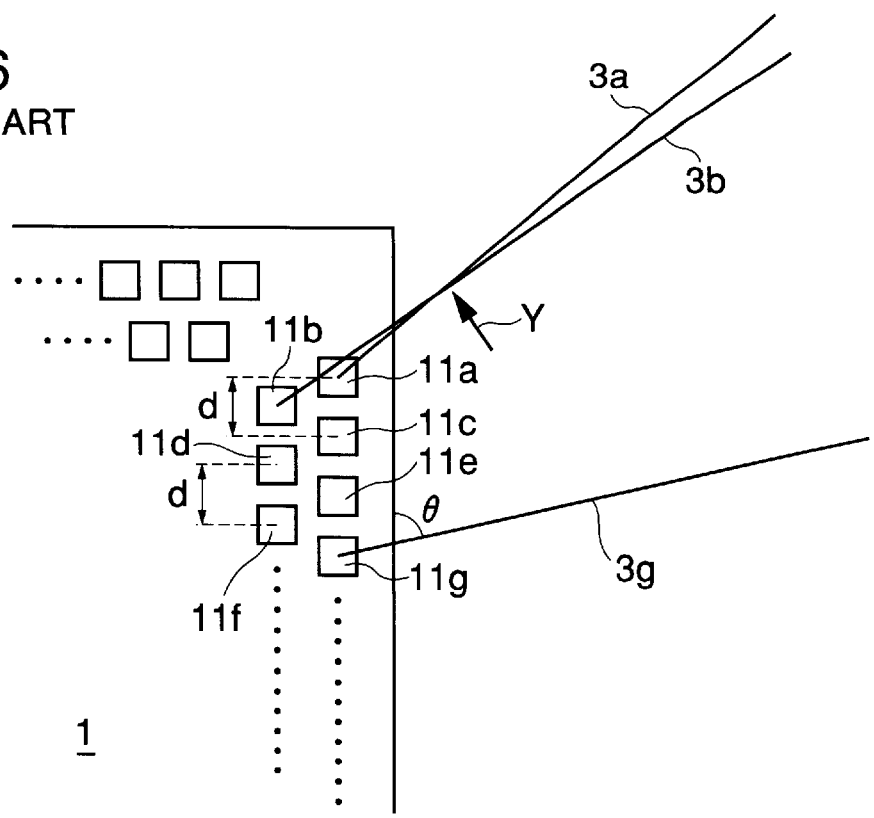
FIG. 6 is still another diagram illustrating how input/output pads are arranged on a semiconductor chip in a conventional semiconductor integrated circuit device.
Figure 7:
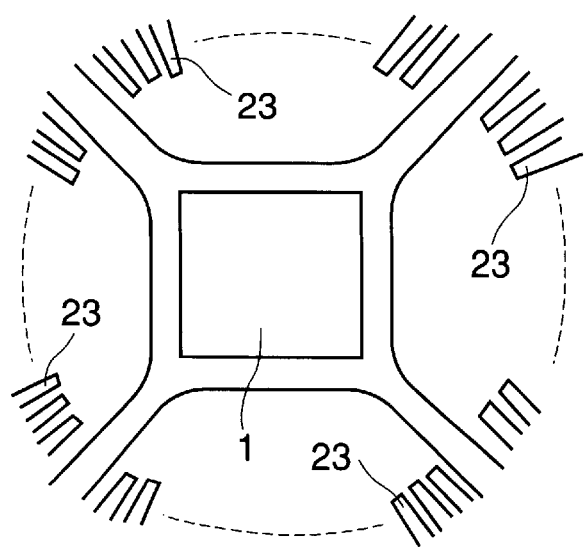
FIG. 7 is a diagram illustrating inner leads arranged radially on a frame.

Furthermore, in arrangements according to the present invention, the relation between the number of pads and the chip size is as indicated by the dashed line L2 in FIG. 4, whereas the same relation in conventional arrangements is as indicated by the solid line L1. Thus, according to the present invention, it is possible to reduce the chip size down to 60 to 70%, and it is also known that the greater the number of input/output pads, the more the chip size can be reduced.

As described heretofore, according to the present invention, it is possible to realize a semiconductor integrated circuit device in which a semiconductor chip of a minimal size can be used and in which, nevertheless, a typical frame having inner leads arranged radially can be used without increasing the thickness of the semiconductor integrated circuit device as a whole.

What is claimed is:

1. A semiconductor integrated circuit device comprising:
   a plurality of input/output pads formed on a semiconductor chip;
   a plurality of inner leads formed on a frame on which said semiconductor chip is mounted, said pads and leads are connected electrically by wire bonding; and a plurality of wires each connecting one input/output pad to a corresponding inner lead, wherein said plurality of input/output pads are a) arranged along at least one line which is located a first predetermined distance from one edge of the semiconductor chip and b) arranged such that an imaginary line, which is parallel to and a second predetermined distance from a wire which connects an adjacent input/output pad to a corresponding inner lead, intersects said at least one line;

wherein said second predetermined distance is a minimal distance.

2. A semiconductor integrated circuit device as claimed in claim 1, wherein said plurality of input/output pads are arranged in such a way that a normal from any input/output pad to at least one of the wires, or the imaginary lines, adjacent to the wire connecting that input/output pad to the corresponding inner lead has a predetermined length that is equal to a minimal distance that allows wire bonding to be performed without interference.

3. A semiconductor integrated circuit device as claimed in claim 1, wherein said plurality of input/output pads are arranged in a plurality of lines along each side of said semiconductor chip in such a way that any two input/output pads whose wires are adjacent to each other are arranged in different lines.

4. A semiconductor integrated circuit device comprising:

a semiconductor chip;

a plurality of input/output pads formed on said semiconductor chip;

a frame on which said semiconductor chip is mounted;

a plurality of inner leads arranged on said frame so as to extend radially with respect to each side of said semiconductor chip; and wires for connecting said input/output pads to said inner leads, wherein, with respect to any two input/output pads that are connected to two adjacent inner leads, one input/output pad a) arranged along one line which is located a first predetermined distance from an edge of the semiconductor chip and b) arranged such that an imaginary line, that is parallel to and a second predetermined distance apart from the wire connecting the other input/output pad to the corresponding inner lead, intersects said one line;

wherein said second predetermined distance is a minimal distance.

5. A semiconductor integrated circuit device as claimed in claim 4, wherein said plurality of input/output pads are arranged in a plurality of lines along each side of said semiconductor chip.

6. A semiconductor integrated circuit device as claimed in claim 4, wherein, at or near a middle point of each side of said semiconductor chip, the wires form approximately right angles with respect to the side of said semiconductor chip.

7. A semiconductor integrated circuit device as claimed in claim 4, wherein said plurality of input/output pads are arranged in two lines along each side of said semiconductor chip in such a way that any two input/output pads that are connected to adjacent inner leads by way of wires are arranged in different lines.

8. A semiconductor integrated circuit device as claimed in claim 4, wherein, with respect to any two input/output pads that are connected to two adjacent inner leads, one input/output pad is placed on an imaginary line that is parallel to and a predetermined uniform distance apart from the wire connecting the other input/output pad to the corresponding inner lead.

* * * * *